(12) United States Patent
Khlat

(10) Patent No.: US 8,334,729 B1
(45) Date of Patent: Dec. 18, 2012

(54) ELIMINATION OF HOT SWITCHING IN MEMS BASED IMPEDANCE MATCHING CIRCUITS

(75) Inventor: Nadim Khlat, Midi-Pyrenees (FR)

(73) Assignee: RF Micro Devices, Inc., Greensboro, NC (US)

( * ) Notice: Subject to any disclaimer, the term of this patent is extended or adjusted under 35 U.S.C. 154(b) by 348 days.

(21) Appl. No.: 12/727,530

(22) Filed: Mar. 19, 2010

Related U.S. Application Data

(60) Provisional application No. 61/161,517, filed on Mar. 19, 2009.

(51) Int. Cl.
*H03H 7/38* (2006.01)
(52) U.S. Cl. ........................................... 333/32
(58) Field of Classification Search ............ 333/32, 333/33
See application file for complete search history.

(56) References Cited

U.S. PATENT DOCUMENTS

| | | |
|---|---|---|
| 7,135,766 B1 | 11/2006 | Costa et al. |
| 2006/0012014 A1 | 1/2006 | Chen et al. |
| 2006/0108675 A1 | 5/2006 | Colgan et al. |
| 2007/0103028 A1 | 5/2007 | Lewis et al. |
| 2007/0172975 A1 | 7/2007 | Tomomatsu et al. |
| 2007/0281381 A1 | 12/2007 | Ayazi |
| 2008/0164542 A1 | 7/2008 | Yang et al. |
| 2011/0304408 A1* | 12/2011 | McKinzie, III ............... 333/32 |

FOREIGN PATENT DOCUMENTS

WO 2007008535 A1 1/2007

OTHER PUBLICATIONS

Chow, L.L.W., et al., "Lifetime Extension of RF MEMS Direct Contact Switches in Hot Switching Operations by Ball Grid Array Dimple Design," Electron Device Letters, Jun. 2007, pp. 479-481, vol. 28, No. 6, IEEE.
Costa, J. et al, "Integrated MEMS Switch Technology on SOI-CMOS," Proceedings of Hilton Head Workshop 2008: A Solid-State Sensors, Actuators and Microsystems Workshop.
Costa, J. et al., "A Silicon RFCMOS SOI Technology for Integrated Cellular/WLAN RF TX Modules," Proceedings of the IEEE MTS Microwave Symposium, 2007, pp. 445-448, IEEE.
Guan, Lingpeng et al., "A Fully Integrated SOI RF MEMS Technology for System-on-a-Chip Applications," IEEE Transactions on Electron Devices, Jan. 2006, pp. 167-172, vol. 53, No. 1, IEEE.

(Continued)

*Primary Examiner* — Stephen Jones
(74) *Attorney, Agent, or Firm* — Withrow & Terranova, P.L.L.C.

(57) ABSTRACT

An antenna tuner has a plurality of switch-capacitor branches made up of a micro-electromechanical systems (MEMS) switch in series with a capacitor such that a branch node is formed between the MEMS switch and the capacitor. A plurality of electronic switches is included wherein the branch node of each of the plurality of switch-capacitor branches is coupled to at least one other branch node of the plurality of switch-capacitor branches with a corresponding one of the plurality of electronic switches. A hot switching sequencing method uses a closed one of the plurality MEMS switch along with one or more of the plurality of electronic switches to reduce the voltage potential across another one of the plurality of MEMS switches that is about to undergo a change of state such as from open to closed or vice versa.

14 Claims, 18 Drawing Sheets

OTHER PUBLICATIONS

Joseph, Alvin et al., "A 0.35 um SiGe BiCMOS Technology for Power Amplifier Applications," IEEE BCTM Conference Proceedings, 2007, pp. 198-201, IEEE.

Kelly, Dylan et al., "The State-of-the-Art of Silicon-on-Sapphire CMOS RF Switches," Proceedings of the IEEE Compound Semiconductor Symposium, 2005, pp. 200-205.

Mazure, Carlos et al., "Engineering Wafers for the Nanotechnology Era," Proceedings of ESSCIRC, 2005, pp. 29-38, IEEE.

Shokrani, Mohsen et al., "InGap-Plus(TM): A Low Cost Manufacturable GaAs BiFET Process Technology," Proceedings of the GaAs Mantech Conference, 2006, pp. 153-156.

Tinella, C. et al, "0.13um CMOS SOI SP6T Antenna Switch for Multi-Standard Handsets," Topic Meeting on Silicon Monolithic Circuits in RF Systems, 2006, pp. 58-61, IEEE.

Tombak, Ali et al., "A Flip-Chip Silicon IPMOS Power Amplifier and a DC/DC Converter for GSM 850 1900/1800/1900 MHz Systems," Proceedings of the IEEE Radio Frequency Integrated Circuits Symposium, 2007, pp. 79-82, IEEE.

Wohlmuth, Walter A. et al., "E-/D-pHEMT Technology for Wireless Components," Proceedings of the Compound Semiconductor Circuit Symposium, 2004, pp. 115-118, IEEE.

Notice of Allowance mailed Apr. 2, 2010 for U.S. Appl. No. 11/955,918.

Final Office Action mailed Jan. 8, 2010 for U.S. Appl. No. 11/955,918.

Non-Final Office Action mailed Jun. 25, 2009 for U.S. Appl. No. 11/955,918.

* cited by examiner

| MM DEVICE | AREA/ [MM] | RON/ [Ω] | COFF/ [fF] |
|---|---|---|---|
| 1 | 0.02495 | 12.60 | 21.43 |
| 2 | 0.040054545 | 6.30 | 42.86 |
| 3 | 0.055022727 | 4.20 | 64.29 |
| 4 | 0.069854545 | 3.15 | 85.71 |
| 5 | 0.08455 | 2.52 | 107.14 |
| 6 | 0.099109091 | 2.10 | 128.57 |
| 7 | 0.113531818 | 1.80 | 150.00 |
| 8 | 0.127818182 | 1.58 | 171.43 |
| 9 | 0.141968182 | 1.40 | 192.86 |
| 10 | 0.155981818 | 1.26 | 214.29 |
| 11 | 0.169859091 | 1.15 | 235.71 |
| 12 | 0.1836 | 1.05 | 257.14 |
| 13 | 0.197204545 | 0.97 | 278.57 |
| 14 | 0.210672727 | 0.90 | 300.00 |
| 15 | 0.224004545 | 0.84 | 321.43 |
| 16 | 0.2372 | 0.79 | 342.86 |
| 17 | 0.250259091 | 0.74 | 364.29 |
| 18 | 0.263181818 | 0.70 | 385.71 |
| 19 | 0.275968182 | 0.66 | 407.14 |
| 20 | 0.288618182 | 0.63 | 428.57 |

*FIG. 7*

ELIMINATION OF HOT SWITCHING IN MEMS BASED IMPEDANCE MATCHING CIRCUITS

RELATED APPLICATIONS

This application claims the benefit of provisional patent application Ser. No. 61/161,517, filed Mar. 19, 2009, the disclosure of which is hereby incorporated herein by reference in its entirety. The application further relates to co-pending U.S. patent application Ser. No. 11/955,918 entitled "Integrated MEMS Switch," filed on Dec. 13, 2007, now U.S. Pat. No. 7,745,892, the disclosure of which is hereby incorporated by reference in its entirety.

FIELD OF THE DISCLOSURE

The present disclosure relates to impedance matching circuits based on micro-electromechanical mechanical system (MEMS) structures.

BACKGROUND

Impedance matching circuits based on MEMS structures such as switches or relays offer the best performance of reduced insertion loss when varying impedance over the Smith chart. However, a MEMS switch used in an impedance matching circuit such as an antenna tuner may be damaged by a potentially harmful differential voltage across the MEMS switch during a process known as hot switching. Hot switching as applied to a MEMS switch means changing the state of the MEMS switch from open to closed or vice versa while a radio frequency (RF) signal or other signal with a damaging potential is present at a terminal of the MEMS switch. Nevertheless, hot switching is a desirable capability for an impedance matching circuit such as an antenna tuner because tuning adjustments may be performed without interrupting a radio signal being processed.

In particular, a MEMS switch is often harmed when a damagingly large differential voltage creates current surges during a state change of the MEMS switch. For example, as an Ohmic type MEMS switch closes, an electric field due to the RF signal may increase to a point that a damaging electrostatic discharge (ESD) may occur. As a beam of the MEMS switch/relay deflects and comes partially into contact with a signal path section, the RF signal can cause a damaging current surge along with arching. Such a surge in current can damage the beam of the MEMS switch/relay and potentially cause switch failure. Even a very small ESD event can degrade the switch contacts of a MEMS switch. Most MEMS manufacturers specify no more than −10 dBm RF power be present on the terminal of a MEMS switch during a hot switching event. Otherwise, most MEMS manufactures warn that MEMS switch reliability can be adversely affected.

An antenna tuner uses one or more MEMS switches to change the impedance of the antenna tuner. For example, in the switchable pi-network of impedance matching circuit 10, the capacitance is changed. In applications where continuous reception or transmission is required an uncontrollable RF RX blocker signal can be present at the antenna 14 at a relatively high level. In the case of concurrent emission of WLAN or WIMAX the level can be as high as high as +10 dBm. In other instances, the presence of −0 dBm blocker levels may come from various sources of interference such as a broadcast Television station or from purposeful blocking signals in military applications, etc. The level of such signals will create a hot switching condition on the MEMS switches 18A-18C and 30A-30C.

FIG. 1 illustrates an impedance matching circuit 10 based on a pi-network topology that may be damaged during a hot switching event due to an uncontrollable receive (RX) blocker 12 that is coupled to an antenna 14. In particular, the impedance matching circuit 10 is an impedance matching network for matching the impedance of a load, and in this case the antenna 14, to a radio frequency (RF) source 16. In the particular example of FIG. 1, the impedance matching circuit 10 is also known as an antenna tuner.

The impedance matching circuit 10 comprises a first plurality of switch-capacitor branches made from MEMS switches 18A, 18B, and 18C and capacitors 20A, 20B and 20C. A first terminal of each of MEMS switches 18A, 18B, and 18C is coupled to a first terminal of a corresponding one of capacitors 20A, 20B, and 20C. In this way, each switch-capacitor branch has a branch node between each one of MEMS switches 18A, 18B, and 18C and the corresponding one of capacitors 20A, 20B and 20C. Moreover, the first plurality of MEMS switches 18A, 18B, and 18C each have a second terminal that is coupled to a first signal node 22. The capacitors 20A, 20B, and 20C are each selectively coupled through the corresponding one of the MEMS switches 18A, 18B, and 18C to the first signal node 22. The capacitors 20A, 20B, and 20C each have a second terminal coupled to a common node, such as a ground node 24. In this configuration, the first plurality of switch-capacitor branches are in parallel with one another.

The RF source 16 has a first terminal coupled to the ground node 24 and a second terminal coupled to the first signal node 22. An inductor 26 has a first terminal coupled to first signal node 22 and a second terminal coupled to a second signal node 28, which in turn is coupled to the uncontrollable RX blocker 12.

The impedance matching circuit 10 also comprises a second plurality of switch-capacitor branches made from MEMS switches 30A, 30B and 30C and capacitors 32A, 32B and 32C. A first terminal of each of MEMS switches 30A, 30B and 30C is coupled to a first terminal of a corresponding one of capacitors 32A, 32B and 32C. In this way, each switch-capacitor branch has a branch node between each one of MEMS switches 30A, 30B and 30C and the corresponding one of capacitors 32A, 32B and 32C. Moreover, the first plurality of MEMS switches 30A, 30B and 30C each have a second terminal that is coupled to the second signal node 28. The capacitors 32A, 32B and 32C are each selectively coupled through the corresponding one of the MEMS switches 30A, 30B and 30C to the second signal node 28. The capacitors 32A, 32B and 32C each have a second terminal coupled to a common node, such as the ground node 24. In this configuration, the second plurality of switch-capacitor branches are in parallel with one another. Each of the MEMS switches 18A, 18B, 18C, 30A, 30B and 30C may be actuated by an electrostatic charge, thermal, piezoelectric or other actuation mechanism initiated by a control signal.

During hot switching, an RF signal from RX blocker 12 leaks onto the second signal node 28 and the first signal node 22 of impedance matching circuit 10. As a result, there is a potentially damaging difference voltage across each of the MEMS switches 18A, 18B, 18C, 30A, 30B and 30C. While, the risk of permanent failure during an individual hot switching event is relatively small, the odds of a permanent failure for at least one of the MEMS switches 18A, 18B, 18C, 30A, 30B and 30C due to repeated actuation and deactuation over millions of cycles is relatively high. Thus, there is a need to provide the benefits of impedance matching circuits based on MEMS structures that minimize or eliminate the damage potential of hot switching.

SUMMARY OF THE DETAILED DESCRIPTION

Embodiments of the present disclosure relate to a circuit topology and a hot switching sequencing approach that uses a closed MEMS switch and a special electronic switch matrix to reduce the voltage potential across another MEMS switch that is about to undergo a change of state such as from open to closed or vice versa.

An embodiment of the present disclosure is an impedance matching circuit having a first plurality of switch-capacitor branches that are in parallel with one another and coupled to a first signal node. Each of the first plurality of switch-capacitor branches comprises a micro-electromechanical systems (MEMS) switch in series with a capacitor such that a branch node is formed between the MEMS switch and the capacitor. A first plurality of electronic switches is included wherein the branch node of each of the first plurality of switch-capacitor branches is coupled to at least one other branch node of the first plurality of switch-capacitor branches with a corresponding one of the first plurality of electronic switches.

The impedance matching circuit also includes a second plurality of switch-capacitor branches that are in parallel with one another and coupled to a second signal node. Each of the second plurality of switch-capacitor branches comprises a MEMS switch in series with a capacitor such that a branch node is formed between the MEMS switch and the capacitor. A second plurality of electronic switches is included wherein the branch node of each of the second plurality of switch-capacitor branches is coupled to at least one other branch node of the second plurality of switch-capacitor branches with a corresponding one of the second plurality of electronic switches. An inductor couples the first signal node to the second signal node.

The impedance matching circuit further includes a control system adapted to:
  selectively actuate and deactuate individual ones of the MEMS switches of the first plurality of switch-capacitor branches to selectively connect and disconnect the respective capacitor of each of the first plurality of switch-capacitor branches to the first signal node;
  selectively actuate and deactuate individual ones of the MEMS switches of the second plurality of switch-capacitor branches to selectively connect and disconnect the respective capacitor of each of the second plurality of switch-capacitor branches to the second signal node;
  selectively activate and deactivate individual ones of the first plurality of electronic switches to reduce the potential difference between the first signal node and the branch node of the MEMS switches of the first plurality of switch-capacitor branches to be actuated or deactuated; and
  selectively activate and deactivate individual ones of the second plurality of electronic switches to reduce the potential difference between the second signal node and the branch node of the MEMS switches of the second plurality of switch-capacitor branches to be actuated or deactuated.

Those skilled in the art will appreciate the scope of the present disclosure and realize additional aspects thereof after reading the following detailed description in association with the accompanying drawings.

BRIEF DESCRIPTION OF THE DRAWING FIGURES

The accompanying drawings incorporated in and forming a part of this specification illustrate several aspects of the invention, and together with the description serve to explain the principles of the invention.

FIG. 7 depicts a FET switch voltage to sustain model.

DETAILED DESCRIPTION

The embodiments set forth below represent the necessary information to enable those skilled in the art to practice the invention and illustrate the best mode of practicing the invention. Upon reading the following description in light of the accompanying drawings, those skilled in the art will understand the concepts of the invention and will recognize applications of these concepts not particularly addressed herein. It should be understood that these concepts and applications fall within the scope of the disclosure and the accompanying claims.

The present disclosure relates to a circuit topology and sequencing approach that reuses an existing closed MEMS switch and a special electronic switch matrix with adequate line transmission to reduce a voltage difference across the first and second terminals on a MEMS switch whose open or closed state is to be changed.

Impedance matching circuits such as antenna tuners have applications in cellular, military, and wireless power arenas.

Embodiments of the present disclosure an advantage of reliability for military systems using MEMS tuners, in cellular systems using MEMS based antenna tuners to enhance transmit radiated power and radiated sensitivity, and in wireless power using MEMS to tune the coupled energy RF power on a resonant inductance if adaptive tuning is used.

Figure 1:
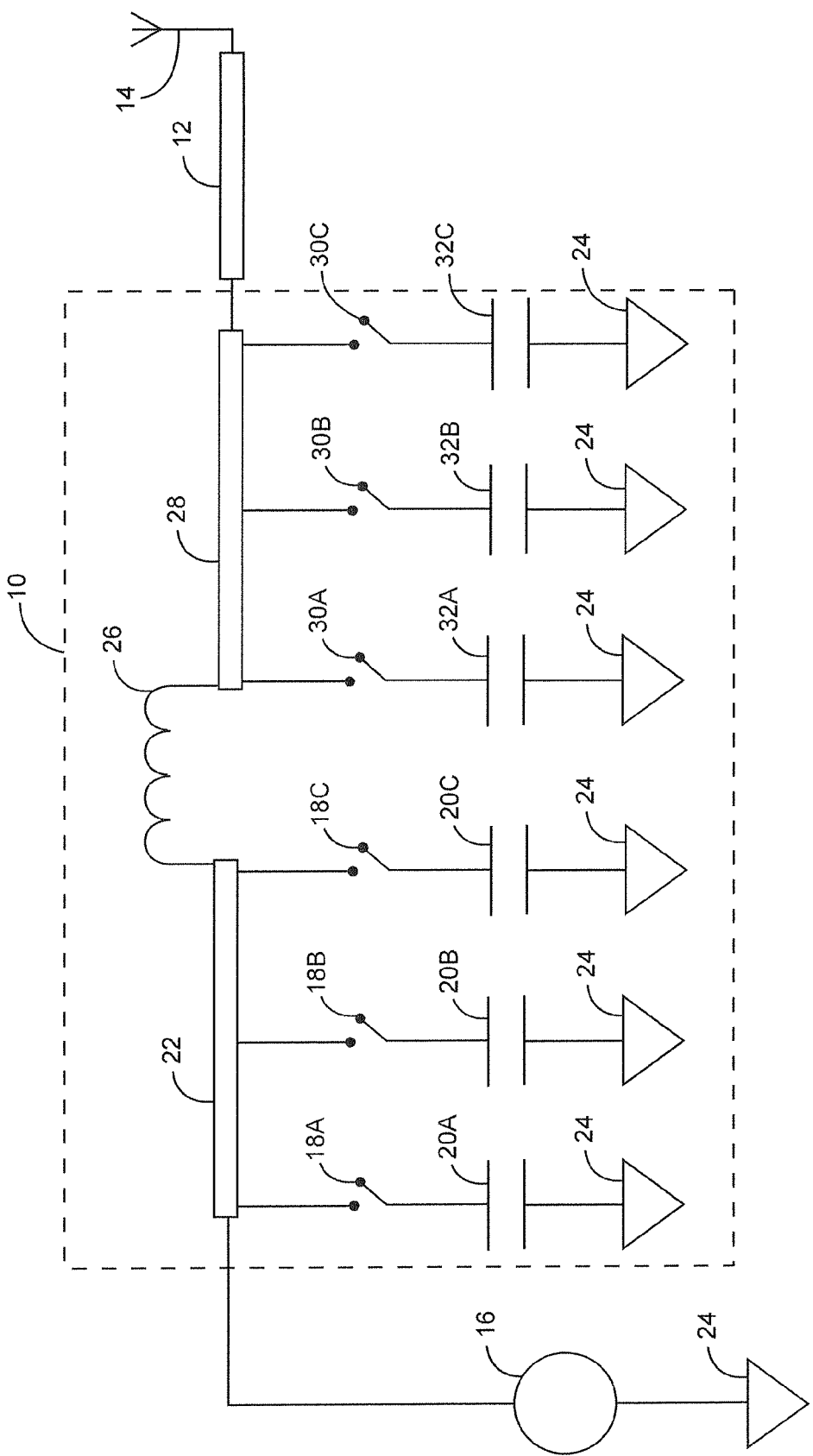
FIG. 1 illustrates a topology of a state-of-the-art antenna tuner.
Figure 2:
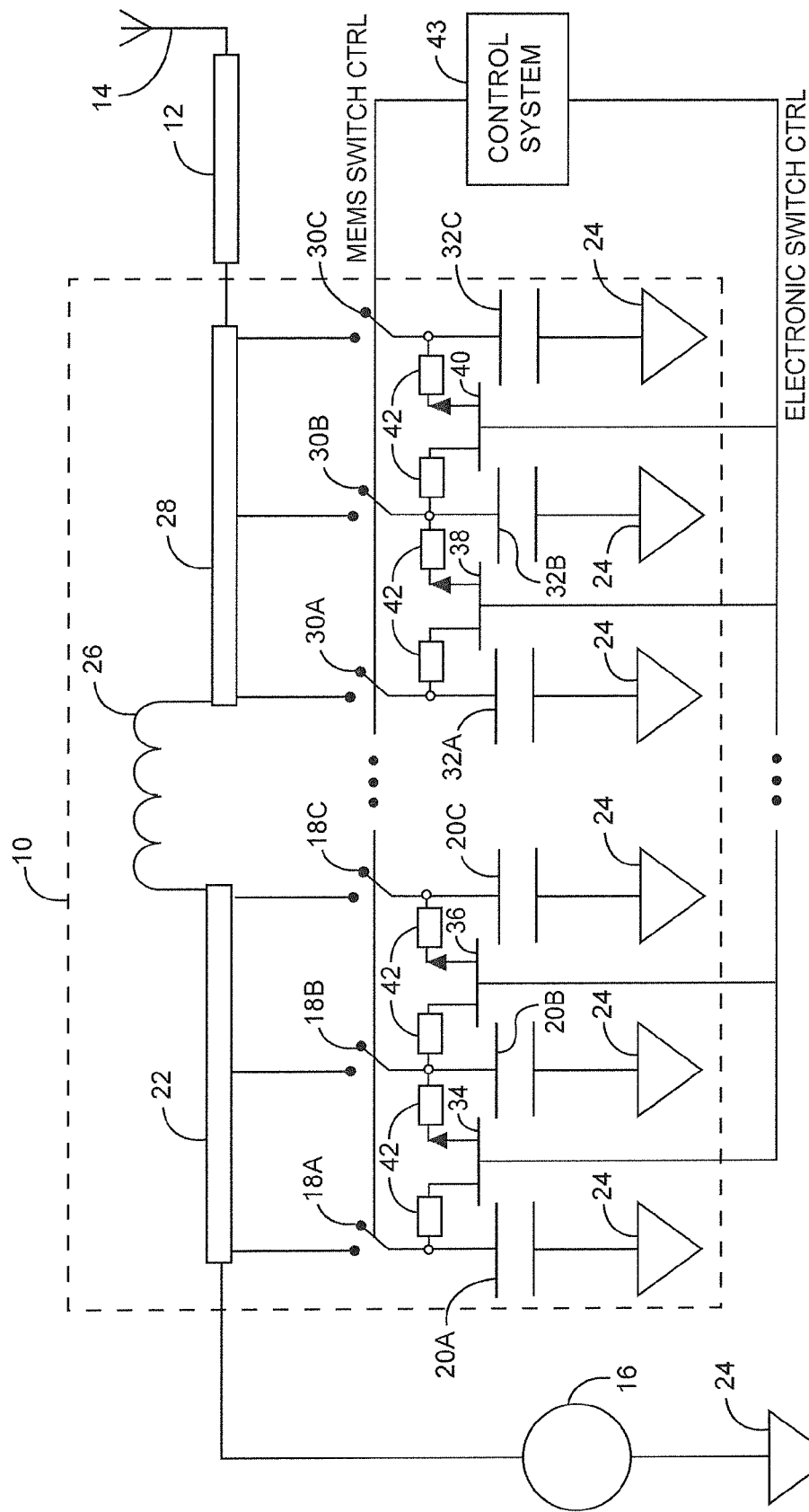
FIG. 2 illustrates the circuit topology of FIG. 1, in which electronic switches are added for selectively reducing the potential differences across each of the MEMS switches during hot switching.

In accordance with the present disclosure, FIG. 2 illustrates the circuit topology of FIG. 1, in which electronic switches are added for selectively reducing the potential differences across each of the MEMS switches 18A-18C and 30A-30C. In a preferred embodiment, the electronic switches are small area field effect transistors (FETs). A first FET 34 has a first terminal coupled to the branch node of switch-capacitor branch that includes MEMS switch 18A. The FET 34 has a second terminal coupled to branch node of the MEMS switch 18B. Similarly, a second FET 36 has a first terminal coupled to the branch node of the switch-capacitor branch that includes MEMS switch 18B. The FET 36 has a second terminal coupled to the branch node of the switch-capacitor branch that includes the MEMS switch 18C. Likewise, a third FET 38 has a first terminal coupled to the branch node of switch-capacitor branch that includes the MEMS switch 30A. The FET 38 has a second terminal coupled to the branch node of switch-capacitor branch that includes the MEMS switch 30B. Also, a fourth FET 40 has a first terminal coupled to the branch node of switch-capacitor branch that includes the MEMS switch 30B. The FET 40 has a second terminal coupled to branch node of switch-capacitor branch that includes MEMS switch 30C. The first and second terminals of FETS 34-40 may be coupled to branch nodes through biasing and/or current limiting elements 42, which are preferably resistors. A control system 43 provides a MEMS switch control signal for actuating and deactuating individual ones the MEMS switches 18A-18C and the MEMS switches 30A-30C. The control system 43 also provides an electronic switch control for activating and deactivating individual ones of the FETs 34-40.

In accordance with the present disclosure, FIGS. 3A-3D illustrate a switch sequencing process for changing the impedance of the impedance matching circuit 10 during a hot switching event. The switch sequencing process reduces the voltage difference across select ones of the MEMS switches 18A-18C and 30A-30C prior to closing or opening the select ones of the MEMS switches 18A-18C and 30A-30C. The control system 43 (FIG. 2) is not shown in FIGS. 3A-3D for the sake of brevity.

Figure 3A:
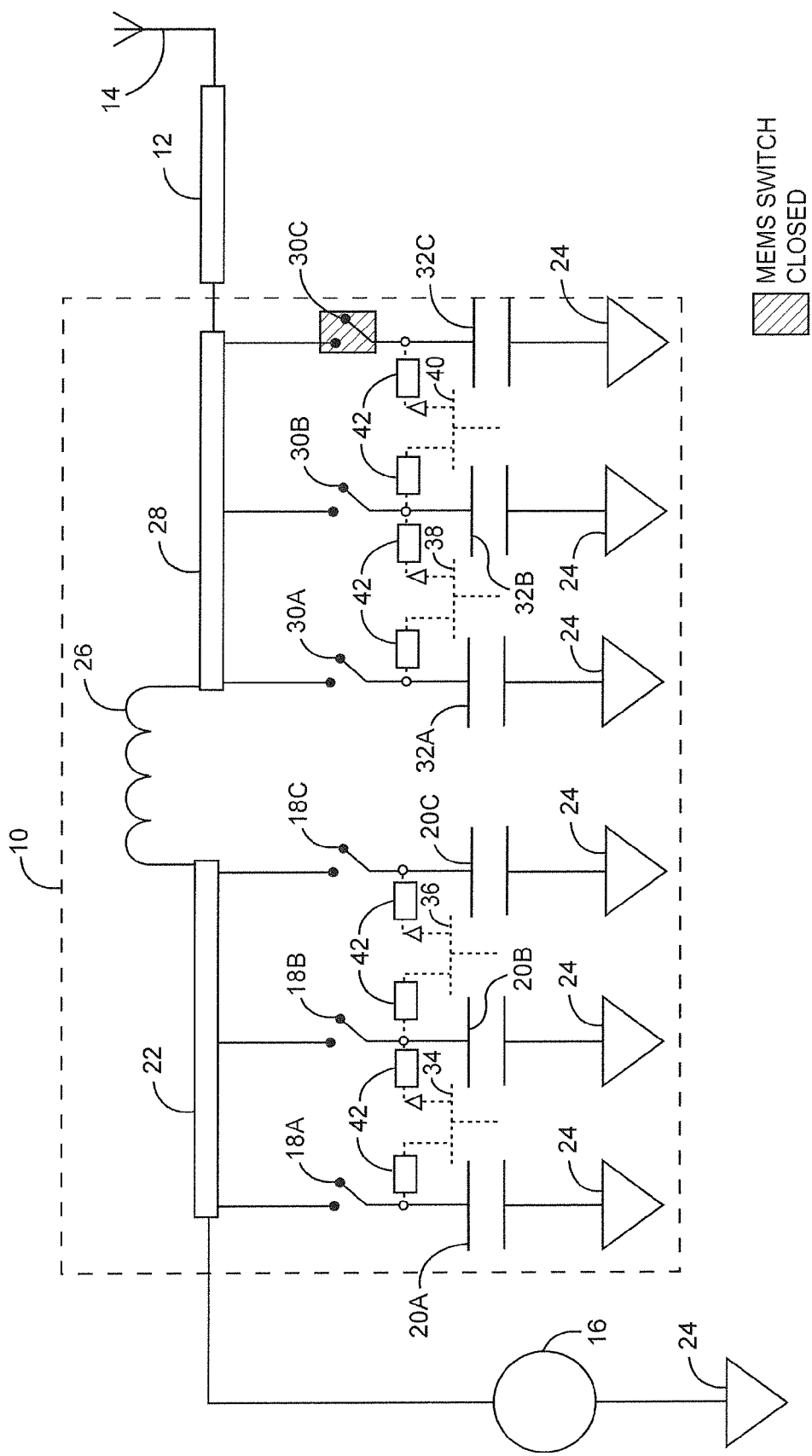
FIG. 3A illustrates a first phase of a switch sequencing process during a hot switching event.

Beginning with FIG. 3A, the FETS 34-40 are off as represented by being shown with dashed lines. In a first phase of the switch sequencing process, the MEMS switch 30C is closed as represented by the hatched rectangle drawn over the switch symbol for MEMS switch 30C. However, it is important to note that any of the MEMS switches 18A-18C and 30A-30C could be closed to begin the switch sequencing process. The MEMS switch 30C is randomly chosen for illustrative purposes only.

Figure 3B:
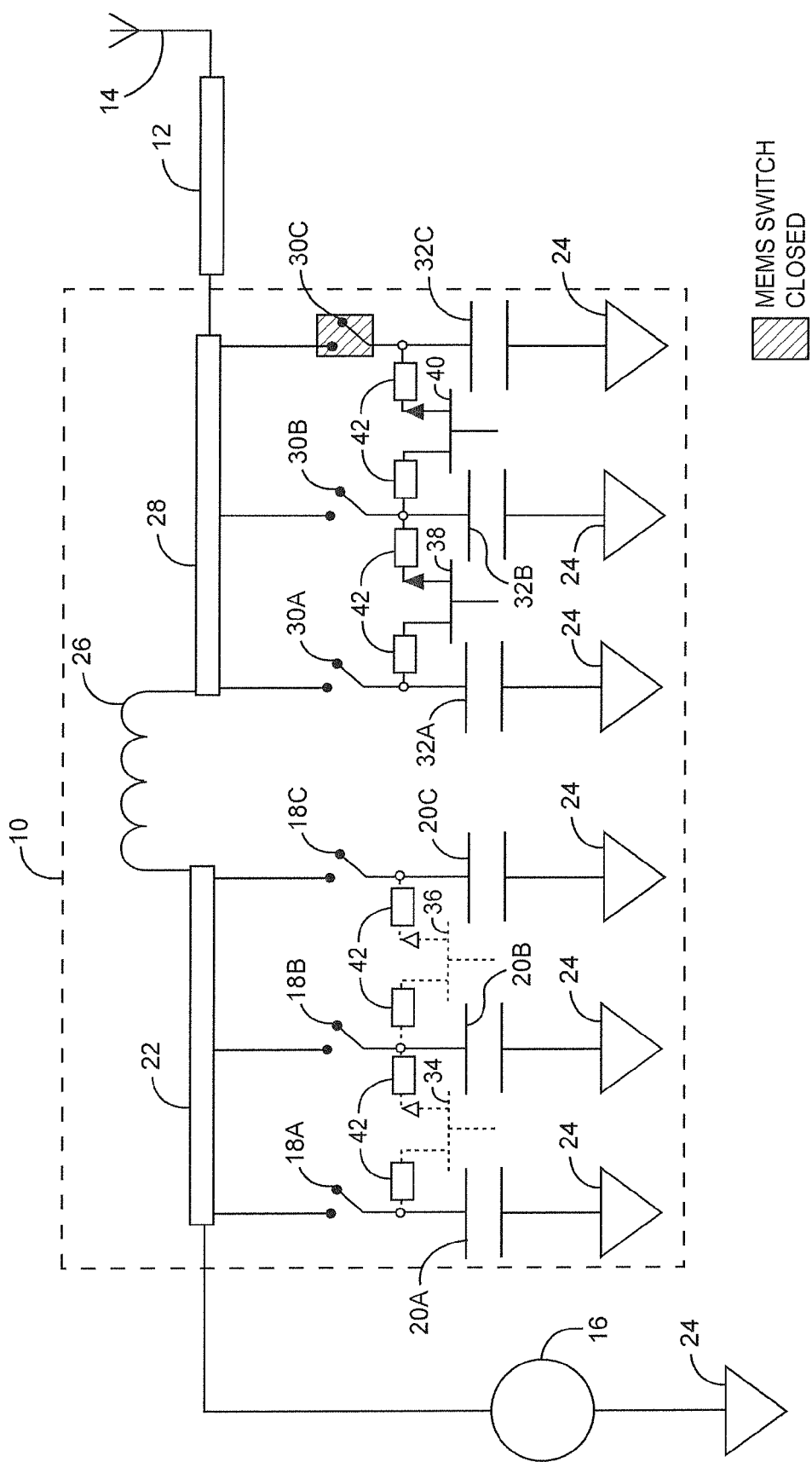
FIG. 3B illustrates a second phase of a switch sequencing process during a hot switching event.

FIG. 3B shows a second phase of the switch sequencing process in which FETS 38 and 40 are turned on as represented by being shown with solid lines. Once the FETS 38 and 40 are turned on transient current flows from the second node 28 to the capacitor 32A and the capacitor 32B to reduce the voltage difference across each of the MEMS switch 30A and the MEMS switch 30B. However, the voltage difference is not reduced to zero due to on state resistances of the FET 38 and the FET 40. Nevertheless, the remaining voltage difference across each of the MEMS switch 30A and the MEMS switch 30B is reduced to a level that prevents damage to the MEMS switch 30A and the MEMS switch 30B during a hot switching event.

Figure 3C:
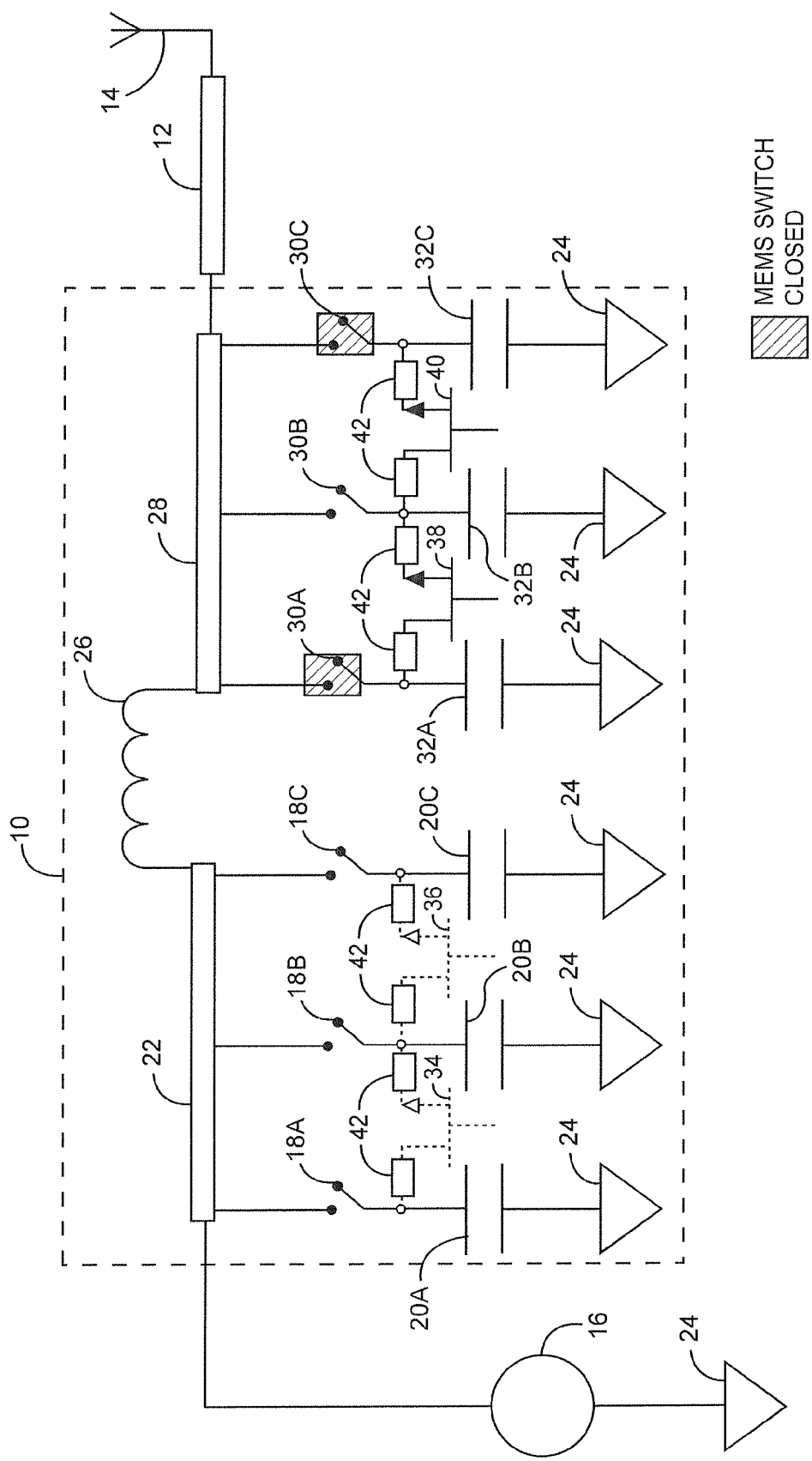
FIG. 3C illustrates a third phase of a switch sequencing process during a hot switching event.

FIG. 3C depicts a third phase in which MEMS switch 30A is closed as represented by the hatched rectangle drawn over the switch symbol for MEMS switch 30A. Just prior to the closure of the MEMS switch 30A, the voltage across the capacitor 32A is equal to the node voltage of the second signal node 28 with respect to ground 24 minus the relatively small voltage drops across the FET 38 and the FET 40, which are active during the third phase. Therefore, the MEMS switch 30A is closed without a risk of damage from ESD due to hot switching because the voltage difference across the MEMS switch 30A is reduced to a safe level.

Figure 3D:
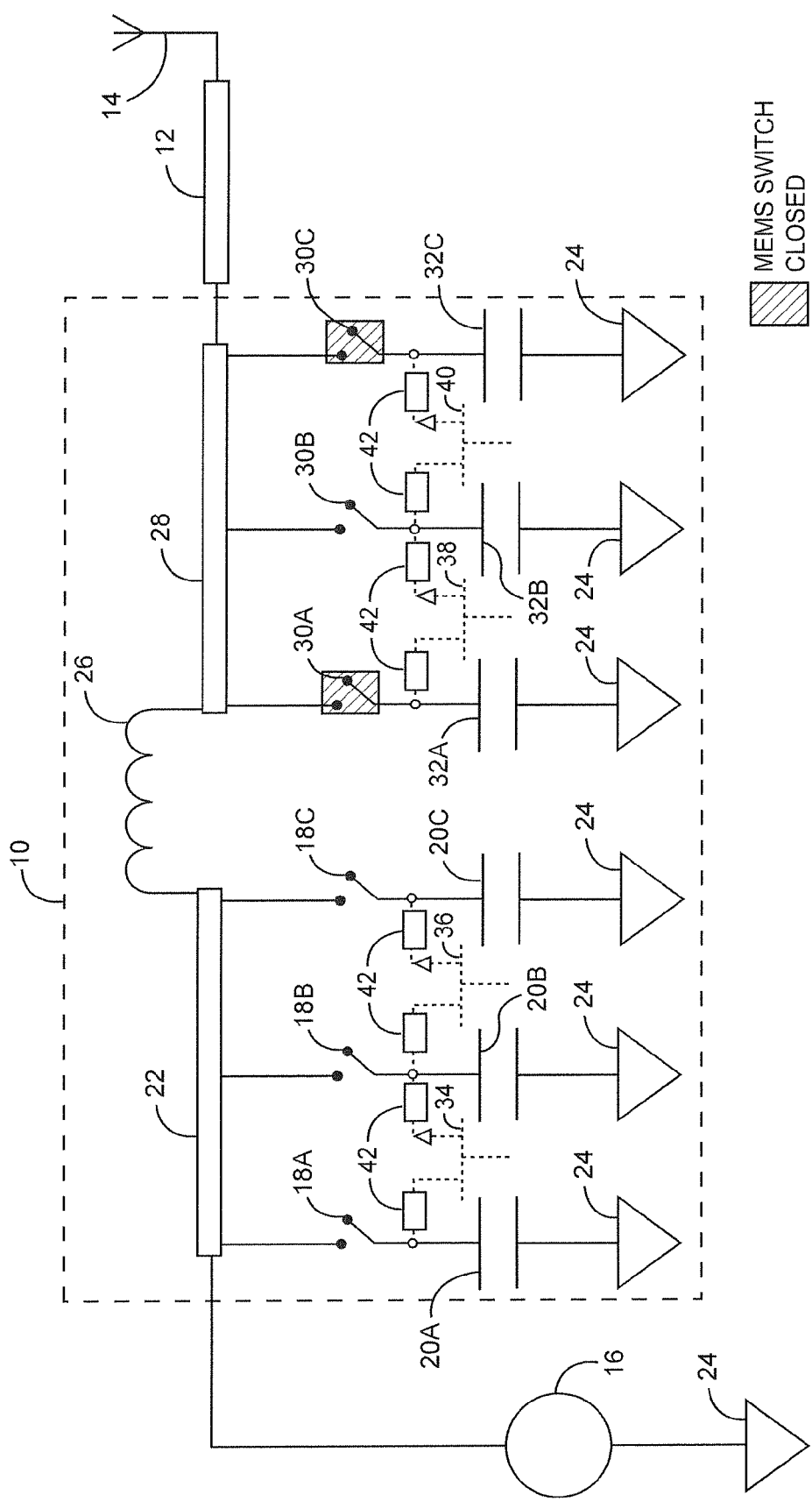
FIG. 3D illustrates a first phase of a switch sequencing process during a hot switching event.

FIG. 3D shows a fourth phase in which the FET 38 and the FET 40 are switched off as represented by as represented by being shown with dashed lines. At this point in the switch sequencing process for the hot switching is complete and the impedance of the impedance matching circuit 10 has been changed by adding the capacitances of capacitors 32A and 32C, respectively. A similar switch sequence process is available for MEMS Switches 18A-18C, but it is not shown for brevity. A total switch sequencing time from going from the first phase to the fourth phase is relatively fast, typically amounting to less than ten microseconds.

FIGS. 4A-4E illustrate another example of changing the antenna tuning settings of the impedance matching circuit 10. A desired outcome for a hot switching event illustrated in this example is to switch only capacitor 32B into the pi-network of the impedance matching circuit 10. The control system 43 (FIG. 2) is not shown in FIGS. 4A-4F for the sake of brevity.

Figure 4A:
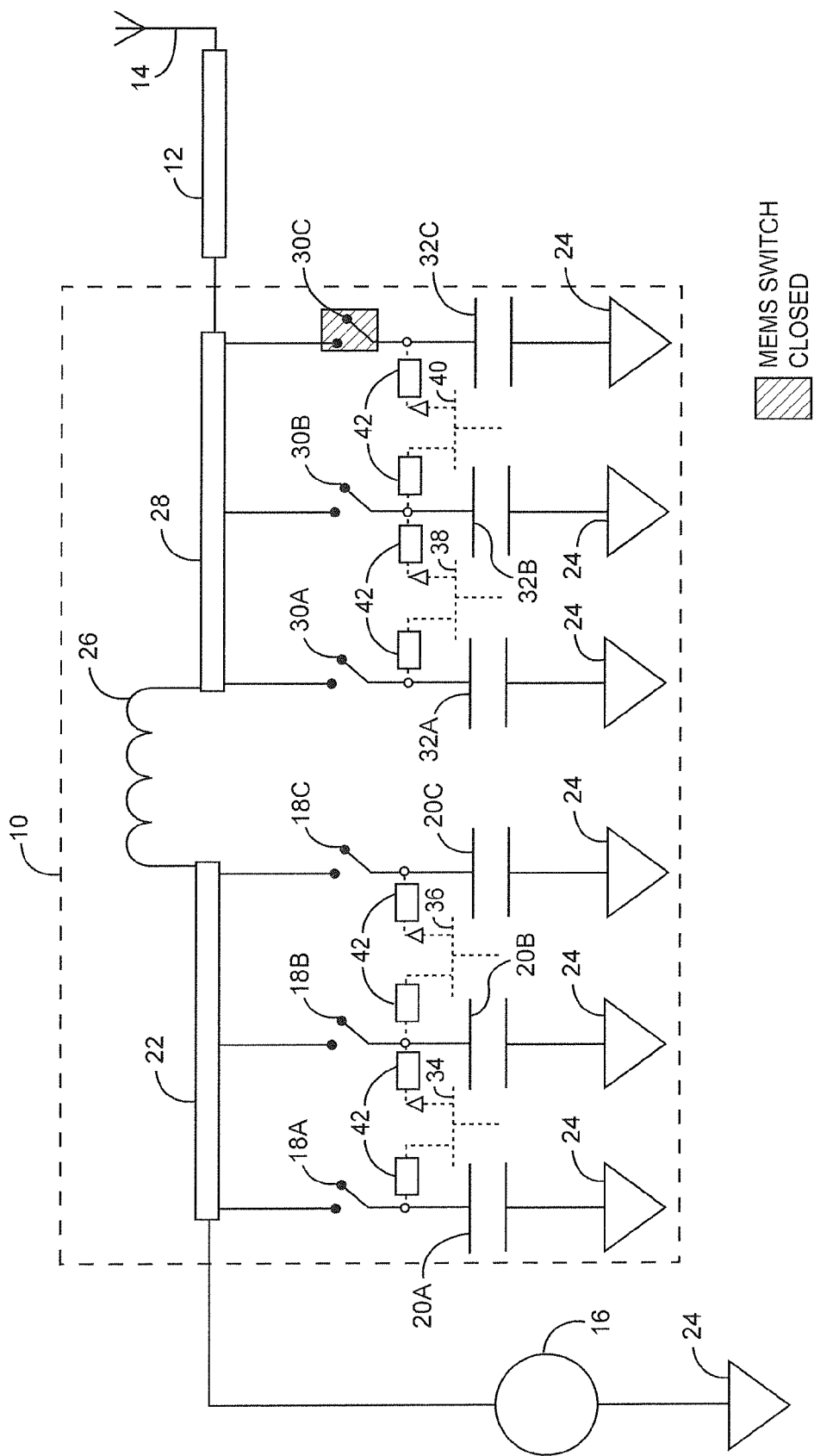
FIG. 4A illustrates a first phase of a second switch sequencing process during a hot switching event.
Figure 4B:
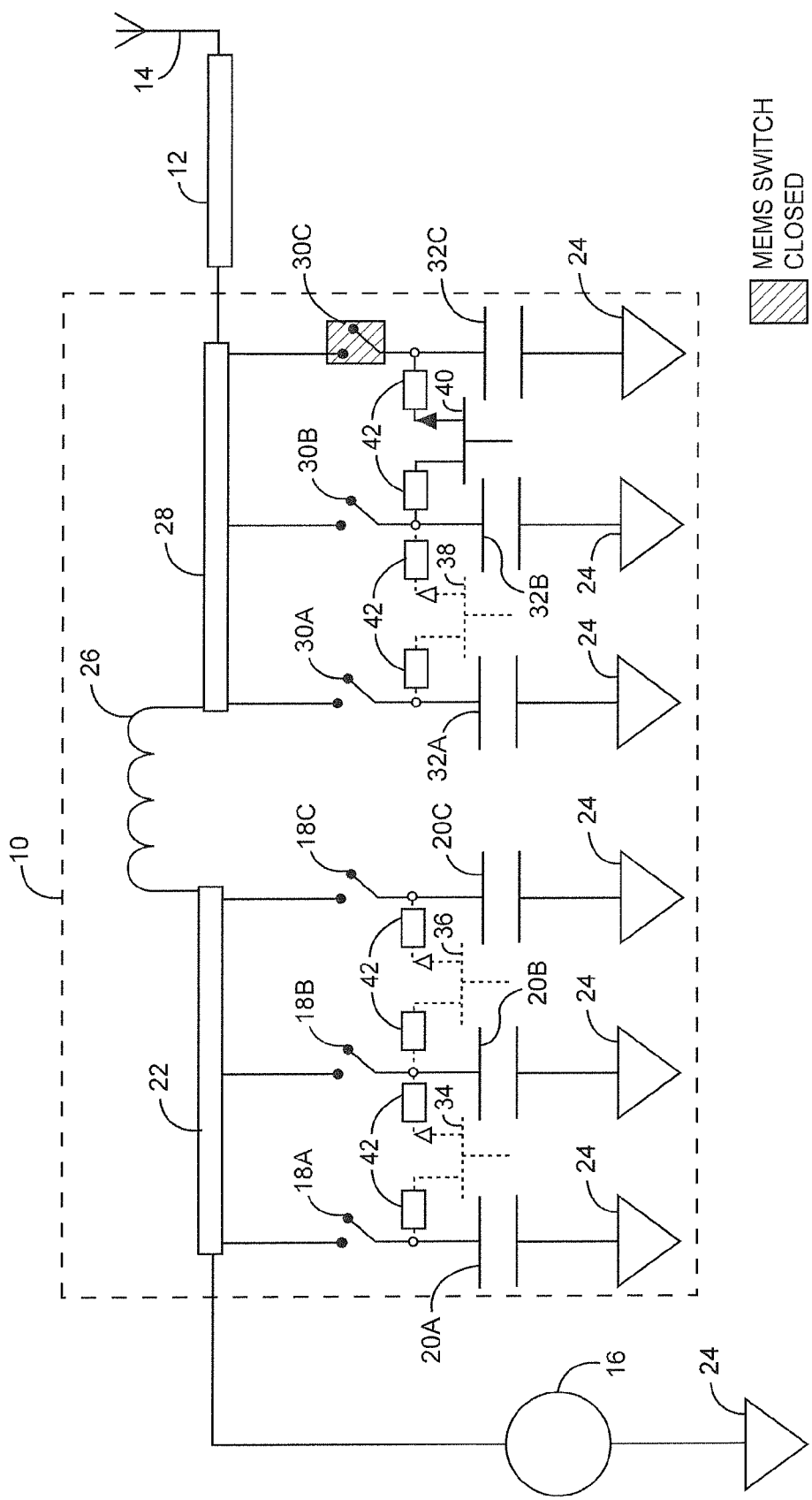
FIG. 4B illustrates a second phase of a second switch sequencing process during a hot switching event.

In a first phase as shown in FIG. 4A, the FETS 34-40 are in an off state as represented by being shown with dashed lines. The MEMS switch 30C is closed as represented by the hatched rectangle drawn over the switch symbol for the MEMS switch 30C. In a second phase shown in FIG. 4B, the FET 40 is turned on as represented by being shown with solid lines. Once the FET 40 is turned on transient current flows from the second signal node 28 to the capacitor 32B to reduce the voltage difference across the MEMS switch 30B. However, the voltage potential is not completely reduced due to on state resistance of the FET 40. Nevertheless, the remaining voltage difference between the source and the drain of the MEMS switch 30B is reduced to a level that prevents damage to the MEMS switch 30B during the hot switching event.

Figure 4C:
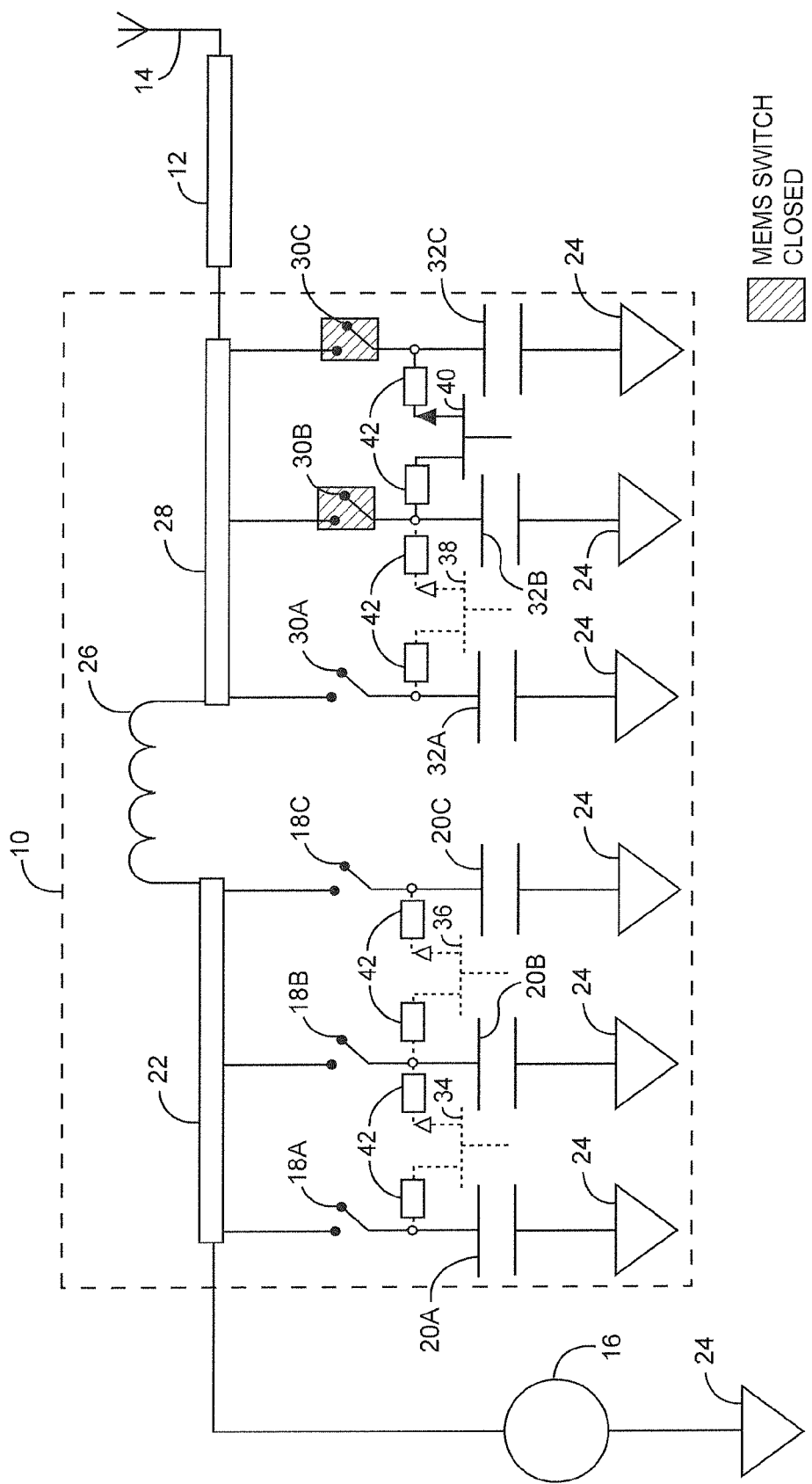
FIG. 4C illustrates a third phase of a second switch sequencing process during a hot switching event.

In a third phase shown in FIG. 4C, the MEMS switch 30B is closed as represented by the hatched rectangle drawn over the switch symbol for the MEMS switch 30B. Just prior to the closure of MEMS switch 30B, the voltage across the capacitor 32B is equal to the node voltage of the second signal node 28 with respect to ground 24 minus a relatively small voltage drop across the FET 40, which is activate during the third phase. Therefore, the MEMS switch 30B is closed without a risk of damage from ESD due to hot switching because the voltage difference across the MEMS switch 30B is reduced to a safe level.

Figure 4D:
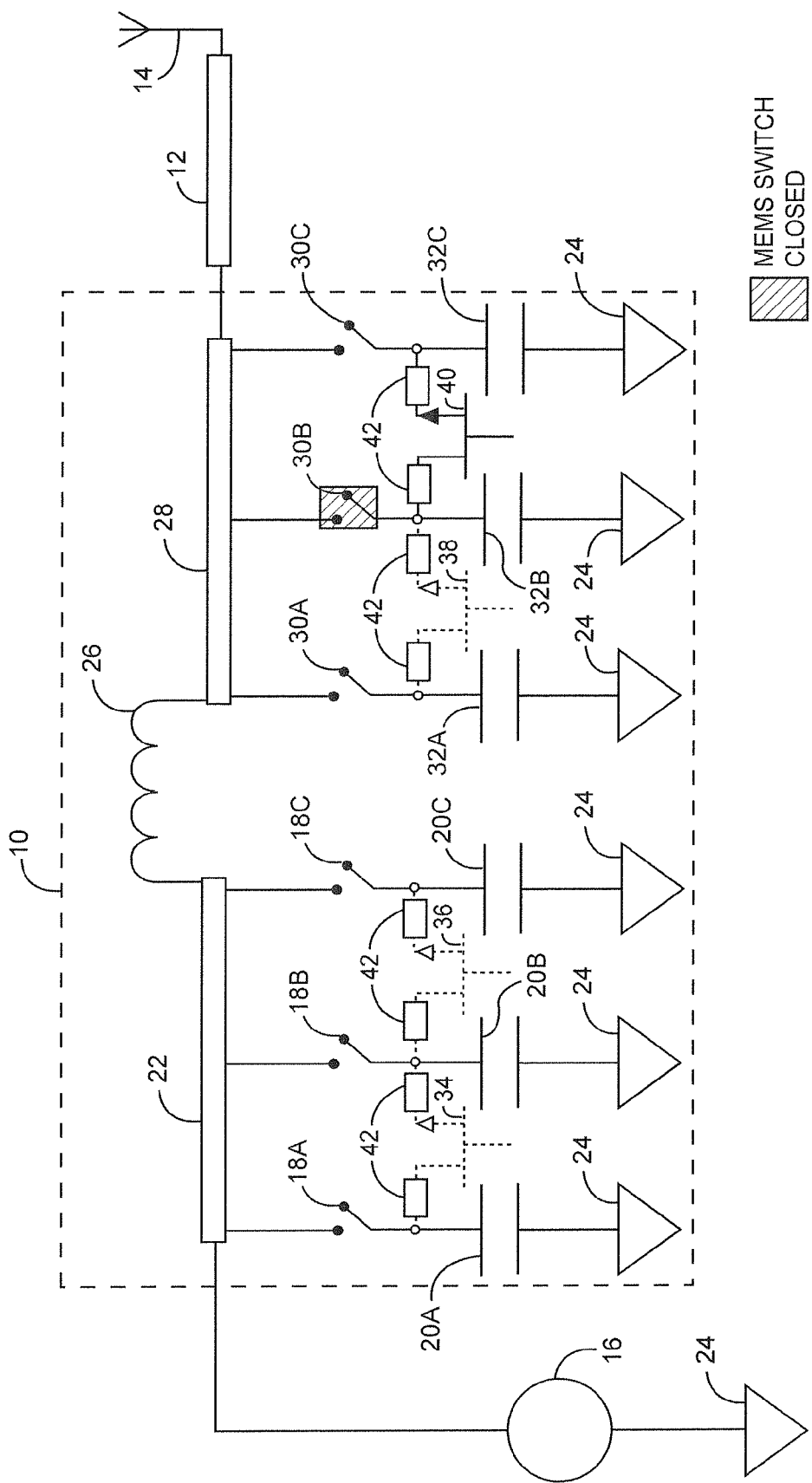
FIG. 4D illustrates a fourth phase of a second switch sequencing process during a hot switching event.

FIG. 4D shows the results of a fourth phase in which the MEMS switch 30C is opened. The FET 40 preferably remains active while the fourth phase is being implemented. In this way, the voltage across the MEMS switch 30C is insured to be at a safe level just before the MEMS switch 30C is actuated to open.

Figure 4E:
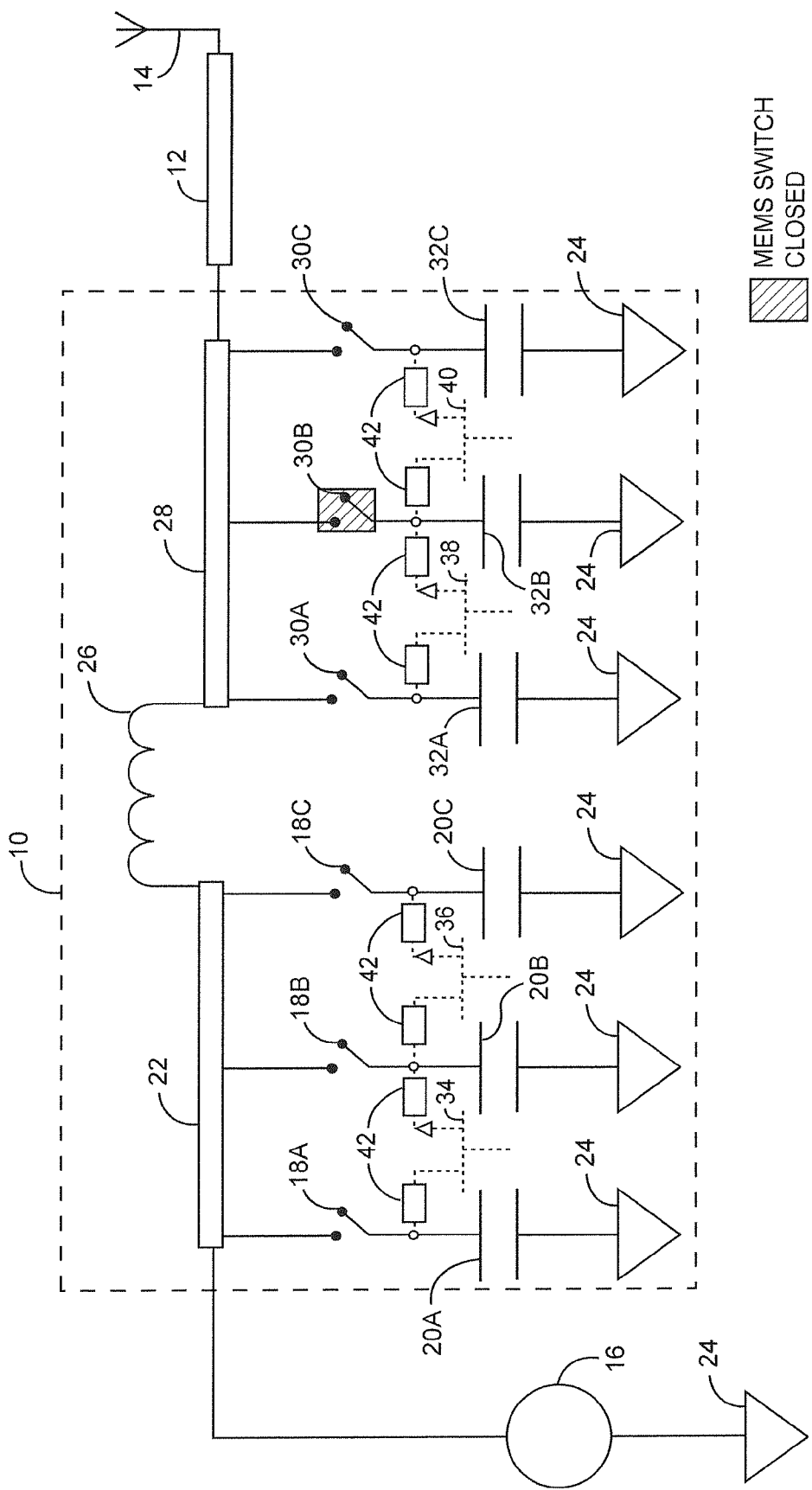
FIG. 4E illustrates a first phase of a second switch sequencing process during a hot switching event.

In a fifth phase shown in FIG. 4E, the FET 40 is turned off as represented by being shown in dashed lines. At this point in the switch sequencing process for the hot switching event is complete and the impedance of the impedance matching circuit 10 has been changed by adding the capacitance of capacitor 32B to the second signal node 28. A similar switch sequence process is available for MEMS Switches 18A-18C, but it is not shown for brevity. A total switch sequencing time from going from the first phase to the fourth phase is relatively fast, typically amounting to less than ten microseconds.

Figure 5:
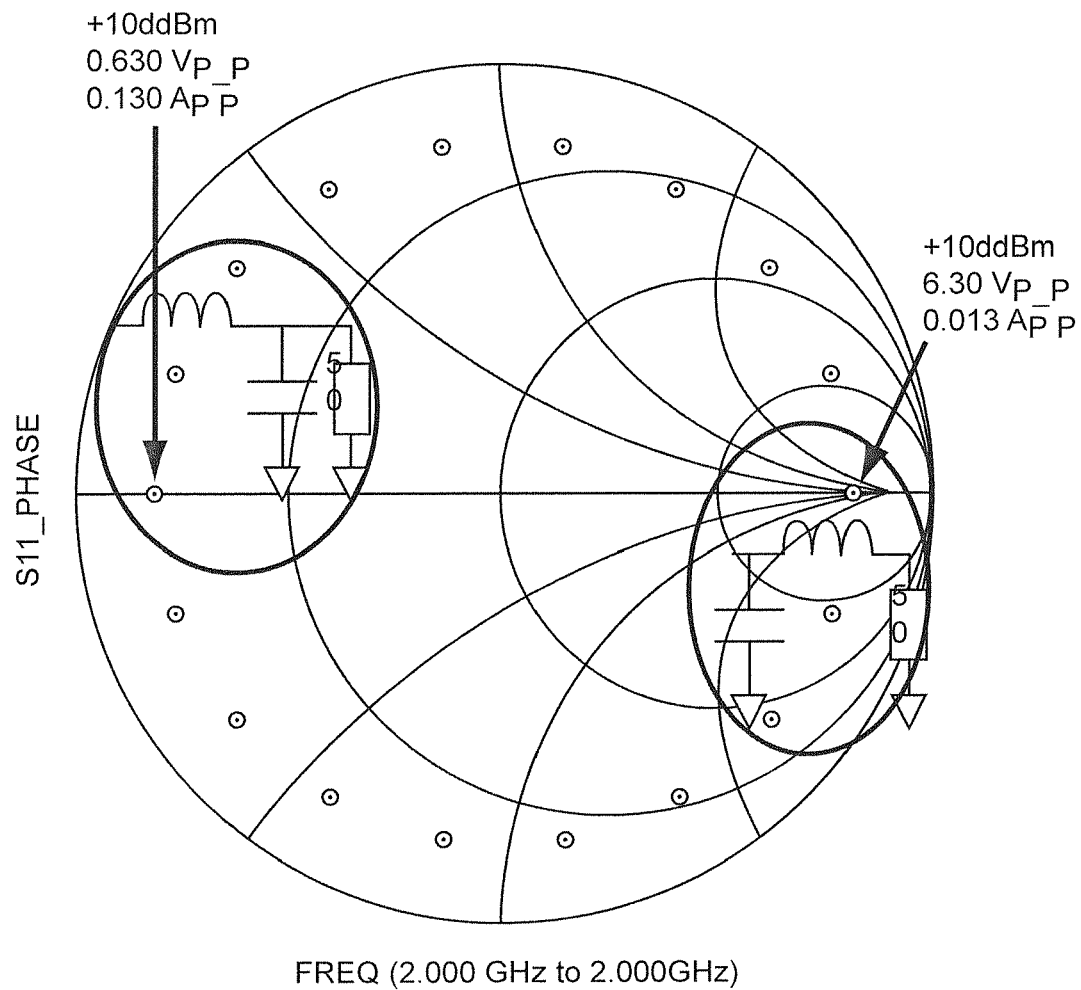
FIG. 5 illustrates varying impedance over the Smith chart according to the present disclosure.

FIG. 5 is a Smith chart that depicts the current expected for individual ones of FETs 34-40 across the Smith chart for a 10:1 VSWR antenna referred to fifty Ohms. As illustrated by the Smith chart, the FETs 34-40 may be relatively physically small since the FETs 34-40 only need to handle the power of RX blocker 12, which cannot exceed +10 dBm, as compared to the MEMS switches designed to handle for example +35 dBm for cellular applications. The power level of the MEMS switches used with Wideband Code Division Multiple Access (WCDMA) and Long Term Evolution (LTE) do not exceed +32 dBm. Therefore, the current flowing through the FETs 34-40, when activated, corresponds to +0 dBm or +10 dBm if Wireless Local Area Network (WLAN) power levels are used over the range of tuned impedance for the impedance matching circuit 10. For example, assuming a 10:1 VSWR antenna where a reference Z0=50 ohms, a relatively small ~130 mA peak to peak signal for a 5 Ohm impedance tuning and a +10 dBm RX blocker yields a power of about +10 dBm and is calculated via the following equation:

$$10*\log(10)*(5\ ohms*(0.130 Apkpk/2/\sqrt{(2)})^2/0.001 \sim =+10\ dBm.$$

The voltage that the FETs 34-40 should withstand is close to the voltage the MEMS switches 18A-18C and 30A-30C experience. However as shown in FIG. 6, the actual voltage depends on a ratio between a drain to source capacitance CDS_FET of individual ones of FETs 34-36 along with individual values of capacitance for capacitors 20A-20C.

Figure 6:
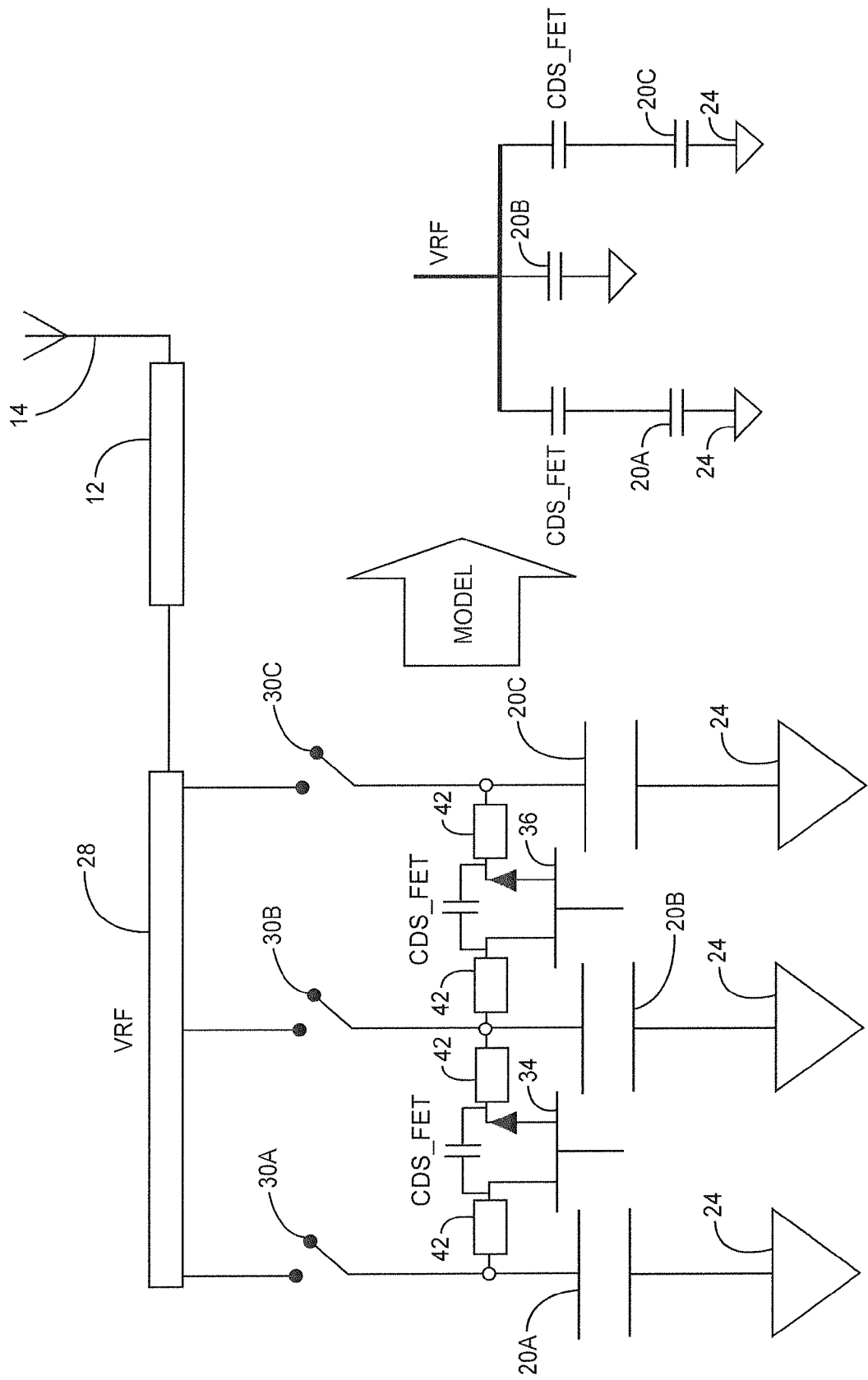
FIG. 6 is a table that includes an estimation of FET sizes for selecting FETS in accordance with the present disclosure.

A model pointed to by the arrow of FIG. 6 is useable to evaluate the effects of the RF voltage (VRF), both forward and reverse, at the second signal node 28 when the MEMS switch 30B is closed during maximum power transmission. In contrast, when the FET switches are in an OFF state, the voltage experienced by the FET 34 and the FET 36 can be as large as 89V peak-to-peak for a 500 Ohms equivalent load at a 10:1 VSWR. The voltage across the drain and source of the FET 36 is equal to a maximum RF voltage (VRFmax) multiplied by the capacitance value of the capacitor 20C divided by sum of the capacitance value of the capacitor 20C and CDS_FET. The voltage across the drain and the source of FET 36 is less than VRFmax.

Similarly the voltage across the drain and source of the FET 34 is equal to a maximum RF voltage (VRFmax) multiplied by the capacitance value of the capacitor 20A divided by sum of the capacitance value of the capacitor 20A and CDS_FET. The voltage across the drain and the source of the FET 34 is less than VRFmax.

One limitation of the disclosed switching sequence is that at least one of the MEMS switches 18A-18C and 30A-30C needs to be closed before a safe hot switching event can begin. Thus, in a case where all the MEMS switches 18A-18C and 30A-30C are open a tuning value may not be available. Therefore, a transition from an all open state for the MEMS switches 18A-18C and 30A-30C may be implemented if needed. However, the probability that all the MEMS switches 18A-18C and 30A-30C would be in an open state during operation is relatively low. Therefore, the possibility of damage as a result of a single hot switching event is very low. As a result, the overall expected lifetime of the impedance matching circuit 10 (FIGS. 3A-3D) will not be adversely affected. In a case in which RX blocker 12 can have relatively high power, a transition from an all open state for MEMS switches 18A-18C and 30A-30C to a closed state may be performed when an instantaneous power level of RX blocker 12 is below a damaging threshold. Such a threshold is typically less than 0 dBm, which also minimizes the magnitude of hot switching in this case.

FIG. 7 is a table of FET sizes for choosing a FET having characteristics in accordance with the disclosure. Any MEMS switch and FET clamping should be configured according to the RF voltage across the MEMS device.

Figure 8:
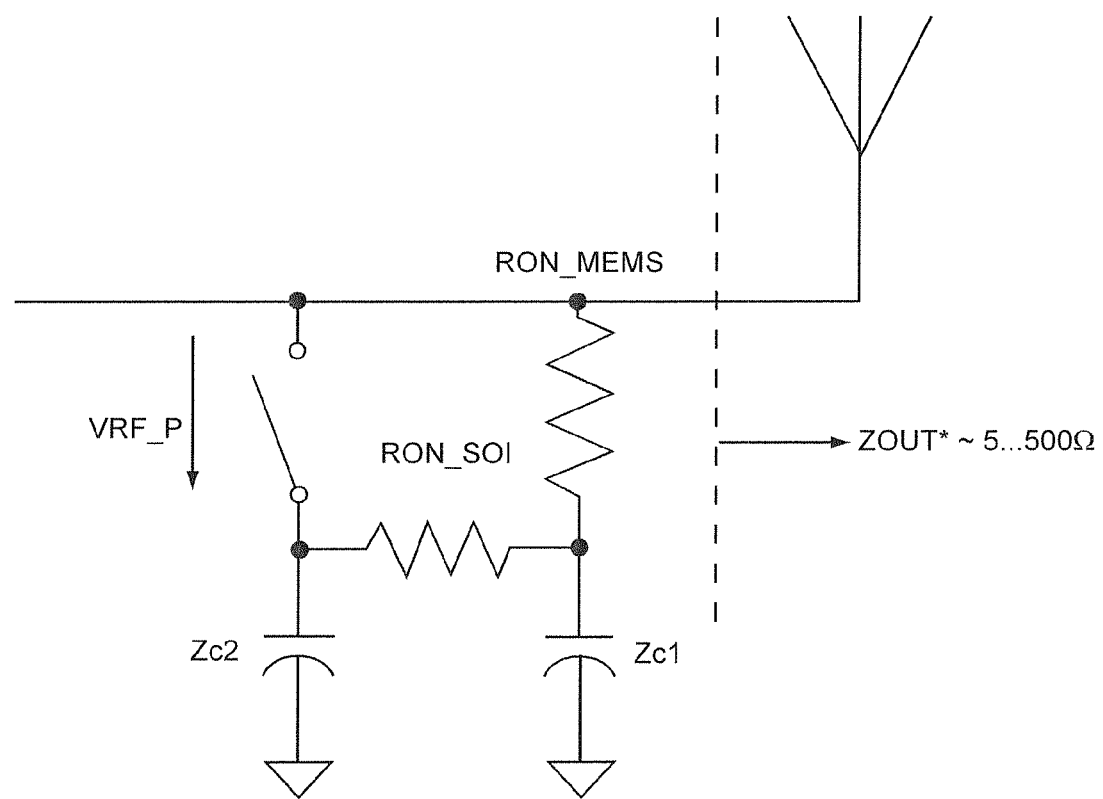
FIG. 8 depicts a model useable to evaluate the Ron_SOI effect of FET switches with regard to an RF voltage potential across a MEMS switch.

FIG. 8 is an equivalent model for the switching sequence of FIG. 3C. The model of FIG. 8 is useable to determine how much hot switching is acceptable. The model is developed under an assumption of binary scaling for the capacitors 32A-32C. Another assumption is based on a 10 dBm WLAN signal at the antenna 14 (FIG. 3C). A further assumption of −10 dBm RF power across the MEMS switch 30B is a safe assumption. Yet another assumption is that ESD protection would work without a shunt attenuator approach. In this case most of the RF voltage should be present over the capacitor 32B. As a result, a voltage divider of 10:1 for 20 dB is required.

For example, assume a 2 GHz case with the capacitor 32B having a capacitance of around ~4 pF which (−j 20 W), and the capacitor 32C having a capacitance of about ~2 pF (−j 40 W) and an Ron_MEMS=0.5 W. If the −10 dBm acceptable blocker level across the MEMS switch 30B is realized then a protection FET of about 1.25 Ohms of resistance is needed. When using FETs fabricated in a Silicon On Insulator (SOI) process, the on resistance of a FET is known as Ron_SOI. Typically, around fourteen stacks in thin film SOI is needed to withstand a voltage of 89V. Moreover, 10 mm FET devices each with an area of 0.156 sqmm are needed. Further still, the least significant of the binary scaled capacitors have higher impedance and can be made smaller.

The FETs 30-40 are only turned on transiently during the sequences of closing a new set of MEMS switches. When the FETs 36 and 40 are connected together for the second signal node 28 side of the pi-network a mismatch of impedance is presented at the antenna for both wanted signals and for any external blocker source. However, the transient mismatch impedance will still maintain a reception of the wanted signal and blocker signal to attenuate them further in a receive chain.

Figure 9:
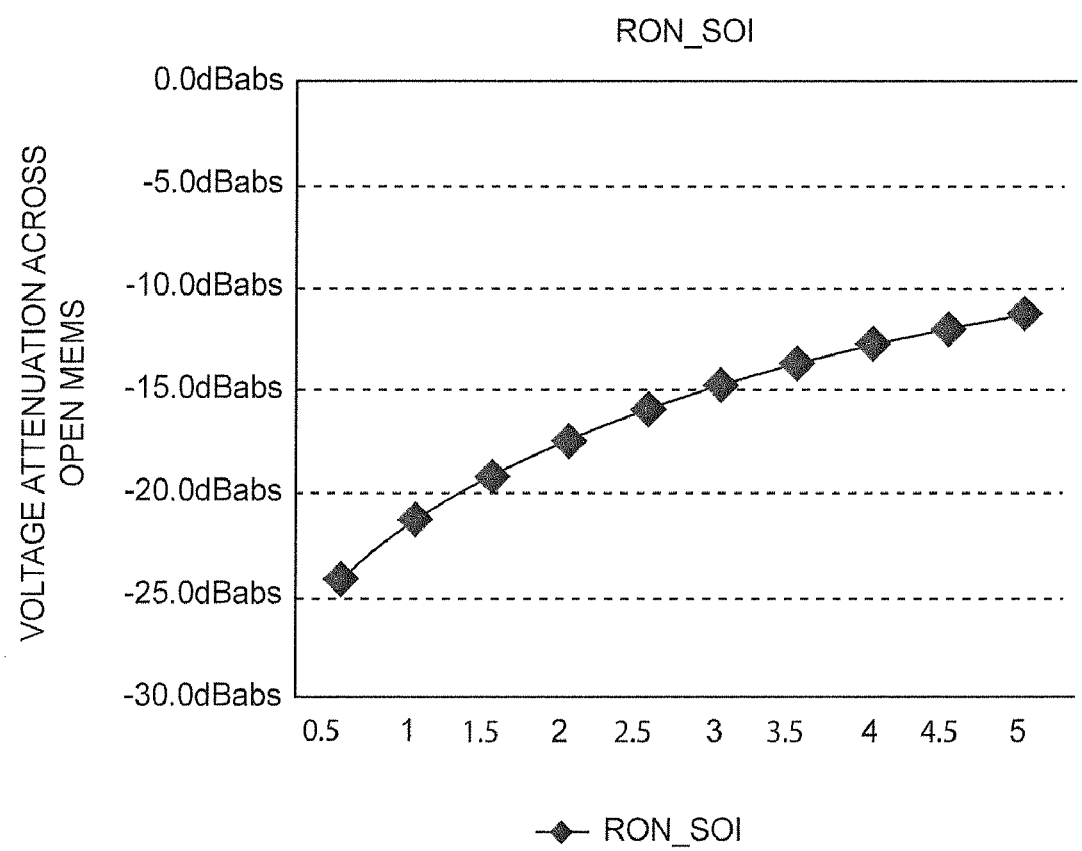
FIG. 9 is a graph showing a ratio of voltage across an open MEMS switch versus Ron_SOI for a FET switch.

The worst case occurs if when the closed MEMS switch at time n is "far away" from the new MEMS switch to be closed, several FET switches must be turned on, which in the case of three shunt capacitors on an antenna node means 2xRon_SOI must be accounted for in the calculation. FIG. 9 is a graph showing a ratio of voltage across an open MEMS switch versus Ron_SOI for a FET switch.

Using the previous calculation, ~0.7 ohm would be needed for each FET segment (thin film 14 stacked) for a +10 dBm WLAN blocker presence (calculated as +18 dBm WLAN maximum power and −8 dB of antenna coupling).

This is high for the +10 dBm initial power to handle for hot-switching, as this WLAN blocker is a "controlled" blocker since the mobile terminal knows when this occurs. As such, the switch events may be performed only during the valley time of the WLAN modulation, at least when it is 10 dB below, with a result near the case of "uncontrollable" blockers that are specified at +0 dBm coming from external Television stations.

Figure 10:
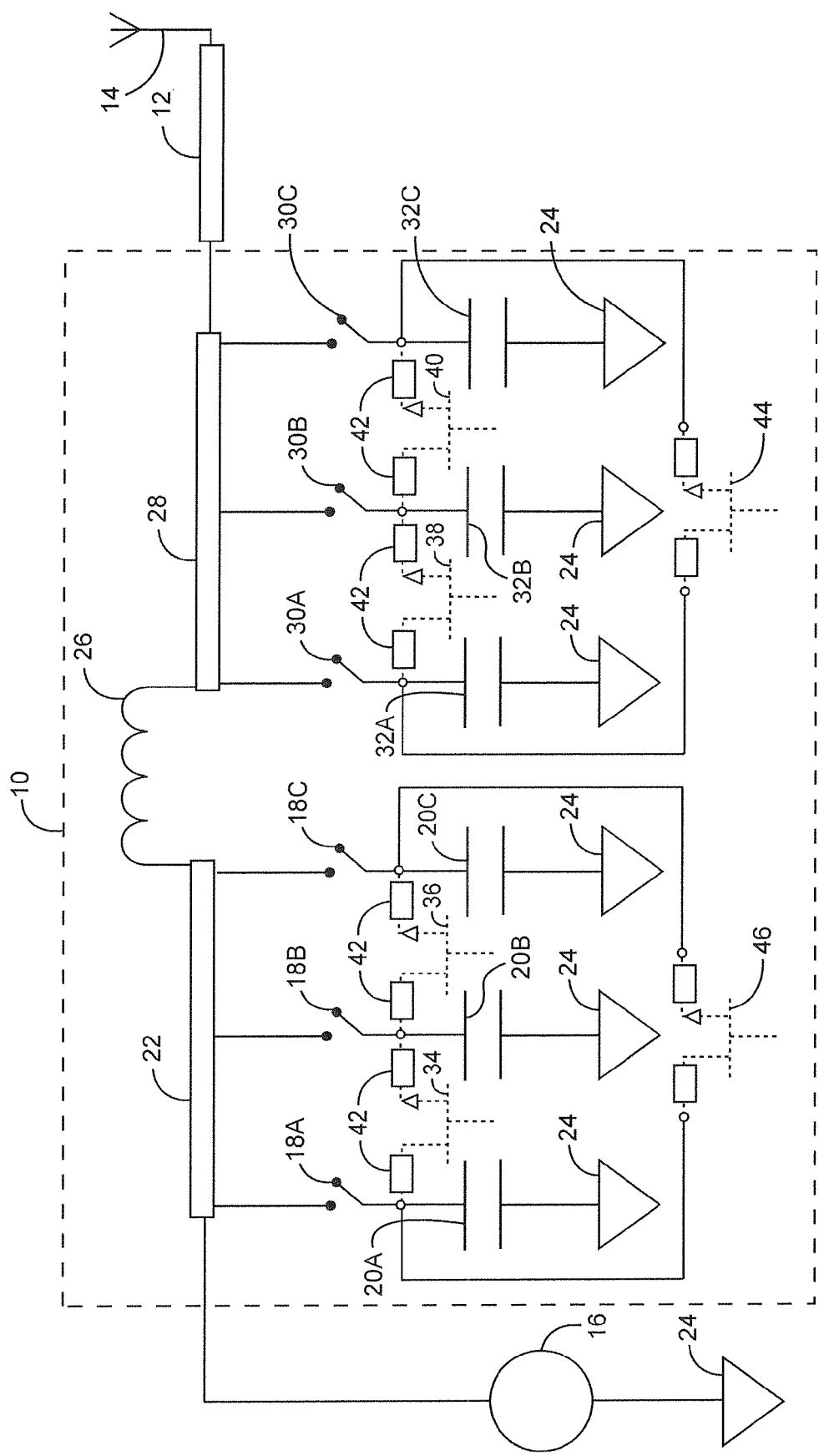
FIG. 10 illustrates how addition FET switches can be used to create a circular connection of a MEMS switch group in order to reduce a worst case for RDS_ON.

FIG. 10 depicts the addition of a FET 44 that has a first terminal coupled to the branch node of switch-capacitor branch that includes MEMS switch 30C. The FET 44 has a second terminal coupled to the branch node of the MEMS switch 30A. The advantage of this configuration is that the overall Ron_SOI is reduced when applying a voltage present at the branch node of MEMS switch 30C to the branch node of MEMS switch 30A. Additionally, a FET 46 has a first terminal coupled to the branch node of MEMS switch 18C and a second terminal coupled to the branch node of MEMS switch 18A. Similar to the FET 44, the FET 46 is useable to reduce the overall Ron_SOI when applying a voltage of the branch node of MEMS switch 18A to the branch node of MEMS switch 18C.

Figure 11:
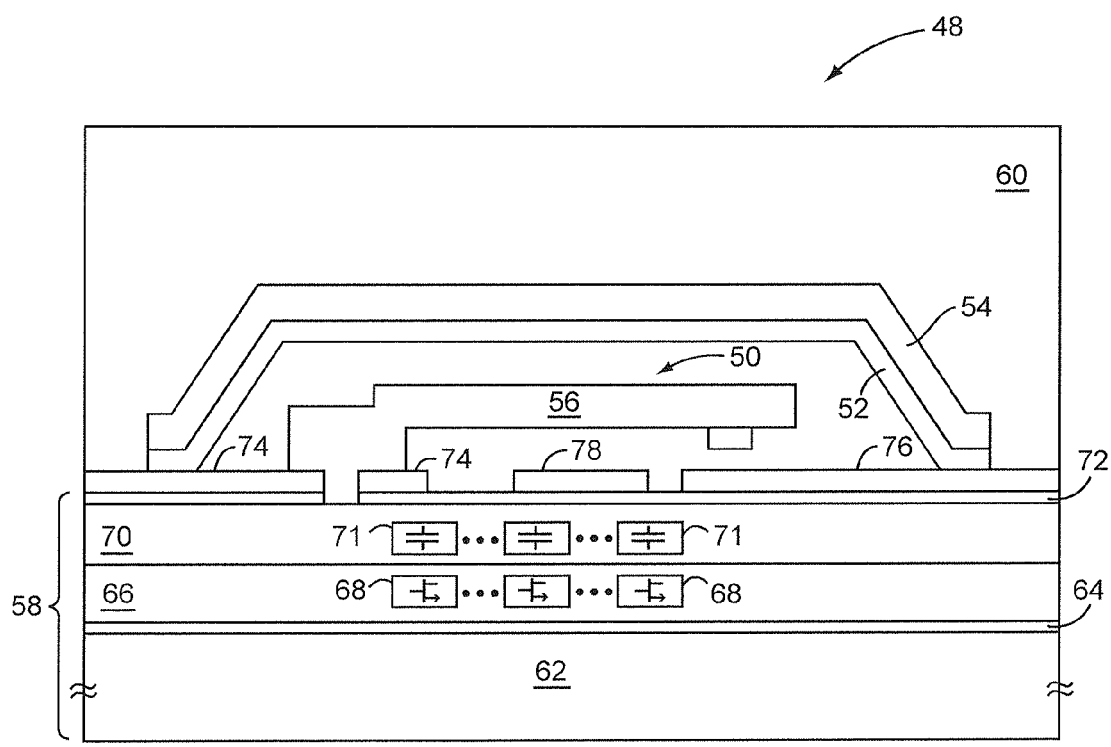
FIG. 11 depicts a MEMS switch and associated FET switches integrated into a device.

Turning back to FIG. 2, the FETs 34-40 are preferably integrated within a complementary metal oxide semiconductor integrated circuit (CMOS IC) that integrates a high voltage generation and a driver for the MEMS switches 18A-18C and 30A-30C along with the control system 43. Turning now to FIG. 11, a device 48 incorporating a MEMS switch 50 such as any one of the MEMS switches 18A-18C and 30A-30C is disclosed. The MEMS switch 50 may be encapsulated by one or more encapsulating layers 52 and 54, which make up a wafer level package (WLP) around the MEMS switch 50. Moreover, the encapsulating layers 52 and 54 form a substantially hermetically sealed cavity about a conductive cantilever beam 56. The cavity is generally filled with an inert gas. Once the encapsulation layers 52 and 54 are in place and any other semiconductor components are formed on the semiconductor substrate 58, a plastic overmold 60 may be provided over the encapsulation layers 52 and 54 and any other semiconductor components.

With continued reference to FIG. 11, the substrate 58 is preferably formed using a 0.18 μm semiconductor-on-insulator (SOI) process. In particular, the substrate 58 includes a handle wafer 62 that is formed from silicon, sapphire, glass, or like material to form a foundation layer for the device 48. The handle wafer 62 is typically a few hundred microns thick. An insulator layer 64 is formed over the handle wafer 62. The insulator layer 64 is generally formed from an oxide, such as Silicon Dioxide ($SiO_2$), which may range in thickness from 0.1 to 2 microns in the preferred embodiment. A device layer 66, which may include one or more layers, is formed using an appropriate semiconductor material.

The device layer 66 is the layer or layers in which a plurality of active semiconductor devices 68, such as the FETs 34-40 (FIG. 2) and diodes that employ PN junctions are formed. The plurality of active semiconductor devices may be formed using a complementary metal oxide semiconductor (CMOS) fabrication process. The device layer 66 is initially formed as a base semiconductor layer that is subsequently doped with N-type and P-type materials to form the active semiconductor devices. Thus, the active semiconductor devices, except for any necessary contacts or connections traces, are generally contained within the device layer 66. Those skilled in the art will recognize various techniques for forming active semiconductor devices in the device layer 66. A metal-dielectric stack 70 is formed over the device layer 66, wherein a plurality of metal and dielectric layers are alternated to facilitate connection with and between the active devices formed in the device layer 66. Capacitor elements 71 with the metal-dielectric stack 70 are usable as the capacitors 20A-20C and 32A-32C (FIG. 2). Further, in the preferred embodiment the handle wafer 62 is made of a high-resistivity semiconductor material where resistance is greater than fifty ohm-cm.

With the present disclosure, the plurality of active semiconductor devices 68 may be formed in the device layer 66 and connected to one another via the metal-dielectric stack 70 directly underneath the MEMS switch 50. Since the device layer 66 resides over the insulator layer 64, high voltage devices, which may exceed ten (10) volts in operation, may be formed directly under the MEMS switch 50 and connected in a way to control operation of the MEMS switch 50 or associated circuitry. Although silicon is described in the preferred embodiment, the semiconductor material for the device layer 66 may include gallium arsenide (GaAs), gallium nitride (GaN), indium phosphide (InP), silicon germanium (SiGe), sapphire, and like semiconductor materials. The device layer 66 typically ranges in thickness from 0.1 microns to 20 or more microns.

As illustrated in FIG. 11, a passivation layer 72 may be provided over the metal-dielectric stack 70. A metal layer used to form a first conductive pad 74, a second conductive pad 76, and a conductive actuator plate 78 for MEMS switch 50 may be formed over the passivation layer 72 and etched to form the respective ones of the first conductive pad 74, the second conductive pad 76, and the conductive actuator plate 78. Prior to packaging, the conductive cantilever beam 56 is 'released' and is free to actuate or deform. In particular, the conductive cantilever beam 56 may be released following formation of a small micro-cavity surrounding the MEMS switch 50. A sacrificial material such as polymethylglutarimide (PMGI) is etched away using wet etches. Following drying and cleaning of the MEMS switch 50, a dielectric is used to hermetically seal the micro-cavity.

The present disclosure thus provides the following:

A tuner system based on MEMS switches, wherein electronic small size switches are added between the 2 adjacent MEMS switches on the drain or source of theses MEMS switches;

The tuner system based on MEMS switches, wherein electronic small size switches are added between the 2 adjacent MEMS switches on the drain or source of theses MEMS switches, where the electronic switches are closed temporarily to connect a closed MEMS switches to the other MEMS switches whose states are to be changed;

The tuner system based on MEMS switches, wherein electronic small size switches are added between the 2 adjacent MEMS switches on the drain or source of theses MEMS switches, where the electronic switches are closed temporarily to connect a closed MEMS switches to the other MEMS switches whose states are to be changed, where the RF voltage across the next MEMS switches whose states are to be changed see a similar RF voltage between its nodes, i.e. source and drain voltage;

The tuner system based on MEMS switches, wherein electronic small size switches are added between the 2 adjacent MEMS switches on the drain or source of theses MEMS switches, where the electronic switches are closed temporarily to connect a closed MEMS switches to the other MEMS switches whose states are to be changed, where sequencing is done such that similar RF voltage is created at the next MEMS switches, then closing or opening of theses switches is performed, opening the electronic switches;

The tuner system based on MEMS switches, wherein electronic small size switches are added between the 2 adjacent MEMS switches on the drain or source of theses MEMS switches, where the electronic switches are closed temporarily to connect a closed MEMS switches to the other MEMS switches whose states are to be changed, where a hot switching source is external RF blocker signals coming via an antenna coupling.

Those skilled in the art will recognize improvements and modifications to the present disclosure. All such improvements and modifications are considered within the scope of the concepts disclosed herein and the claims that follow.

What is claimed is:

1. An impedance matching circuit comprising:
   a first signal node;
   a first plurality of switch-capacitor branches that are in parallel with one another and coupled to the first signal node, wherein each of the first plurality of switch-capacitor branches comprises a micro-electromechanical systems (MEMS) switch in series with a capacitor such that a branch node is formed between the MEMS switch and the capacitor; and
   a first plurality of electronic switches wherein the branch node of each of the first plurality of switch-capacitor branches is coupled to at least one other branch node of the first plurality of switch-capacitor branches with a corresponding one of the first plurality of electronic switches.

2. The impedance matching circuit of claim 1 further including a control system adapted to:
   selectively actuate and deactuate the MEMS switches of the first plurality of switch-capacitor branches to selectively connect and disconnect the respective capacitor of each of the first plurality of switch-capacitor branches to the first signal node; and
   selectively activate the first plurality of electronic switches to reduce a potential difference between the first signal node and the branch node of the MEMS switches of the first plurality of switch-capacitor branches to be actuated or deactuated.

3. The impedance matching circuit of claim 1 further comprising:
   a second signal node;
   a second plurality of switch-capacitor branches that are in parallel with one another and coupled to the second signal node, wherein each of the second plurality of switch-capacitor branches comprises a MEMS switch in series with a capacitor such that a branch node is formed between the MEMS switch and the capacitor;
   a second plurality of electronic switches wherein the branch node of each of the second plurality of switch-capacitor branches is coupled to at least one other branch node of the second plurality of switch-capacitor branches with a corresponding one of the second plurality of electronic switches; and
   an inductor having a first terminal coupled to the first signal node and a second terminal coupled to the second signal node.

4. The impedance matching circuit of claim 3 further including a control system adapted to:
   selectively actuate and deactuate the MEMS switches of the first plurality of switch-capacitor branches to selectively connect and disconnect the respective capacitor of each of the first plurality of switch-capacitor branches to the first signal node;
   selectively actuate and deactuate the MEMS switches of the second plurality of switch-capacitor branches to selectively connect and disconnect the respective capacitor of each of the second plurality of switch-capacitor branches to the second signal node;
   selectively activate the first plurality of electronic switches to reduce the potential difference between the first signal node and the branch node of the MEMS switches of the first plurality of switch-capacitor branches to be actuated or deactuated; and
   selectively activate the second plurality of electronic switches to reduce the potential difference between the second signal node and the branch node of the MEMS switches of the second plurality of switch-capacitor branches to be actuated or deactuated.

5. The impedance matching circuit of claim 4 further including an RF signal source coupled to the first signal node.

6. The impedance matching circuit of claim 4 wherein the MEMS switches are contact switches.

7. The impedance matching circuit of claim 4 further including an antenna coupled to the second signal node.

8. The impedance matching circuit of claim 7 wherein the antenna is coupled to an external RF blocker that is a source of hot switching RF signals.

9. The impedance matching circuit of claim 4 further including an RF signal source coupled to the first signal node and antenna coupled to the second signal node.

10. The impedance matching circuit of claim 9 wherein the antenna is tunable to the RF signal source.

11. The impedance matching circuit of claim 4 wherein the first plurality of electronic switches and the second plurality of electronic switches are field effect transistors (FETs).

12. The impedance matching circuit of claim 11 wherein a footprint area of each of the FETs ranges from 0.02 mm$^2$ to 0.29 mm$^2$.

13. The impedance matching circuit of claim 11 wherein the FETs, capacitors and MEMS switches are integrated into a device.

14. The impedance matching circuit of claim 13 wherein the FETs are formed in a device layer of a substrate, the capacitors are formed in a metallization layer of the substrate and the MEMS switches are formed on the substrate.

* * * * *